United States Patent
Lin et al.

(10) Patent No.: US 10,762,806 B2
(45) Date of Patent: Sep. 1, 2020

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 108 days.

(21) Appl. No.: 15/961,803

(22) Filed: Apr. 24, 2018

(65) Prior Publication Data

US 2019/0325791 A1 Oct. 24, 2019

(51) Int. Cl.
| G09F 13/12 | (2006.01) |
| F21V 13/12 | (2006.01) |
| F21V 13/08 | (2006.01) |
| F21V 9/08  | (2018.01) |

(52) U.S. Cl.
CPC ............. *G09F 13/12* (2013.01); *F21V 9/08* (2013.01); *F21V 13/08* (2013.01); *F21V 13/12* (2013.01)

(58) Field of Classification Search
None
See application file for complete search history.

(56) References Cited

U.S. PATENT DOCUMENTS

| 2016/0033823 | A1* | 2/2016  | Lee  | G02F 1/133617 349/71 |
| 2016/0306226 | A1* | 10/2016 | Yoon | G02F 1/133377 |
| 2017/0227813 | A1* | 8/2017  | Park | G02F 2/02 |
| 2018/0203292 | A1* | 7/2018  | Kim  | G02B 5/201 |
| 2018/0210282 | A1* | 7/2018  | Song | G02F 1/133514 |
| 2019/0018286 | A1* | 1/2019  | Kim  | G02F 1/133504 |
| 2019/0041700 | A1* | 2/2019  | Koo  | G02F 1/133504 |
| 2019/0064600 | A1* | 2/2019  | Jang | G02F 1/133617 |
| 2019/0171067 | A1* | 6/2019  | Lee  | G02F 1/133617 |
| 2019/0196274 | A1* | 6/2019  | Lee  | G02F 1/133621 |
| 2019/0204672 | A1* | 7/2019  | Choi | G02F 1/133606 |
| 2019/0219875 | A1* | 7/2019  | Jung | G02F 1/133514 |
| 2019/0369445 | A1* | 12/2019 | Koo  | G02F 1/133617 |

* cited by examiner

*Primary Examiner* — Ryan Crockett
(74) *Attorney, Agent, or Firm* — Winston Hsu

(57) ABSTRACT

The present disclosure provides a display device including a light source, a substrate on the light source, a first transflective layer on the substrate, a partition layer on the first transflective layer, a first light converting layer, and a second converting layer. The first transflective layer includes at least one hole, and the partition layer includes a first opening, a second opening, and a third opening overlapped with the hole. The first light converting layer is disposed in the first opening, and the second light converting layer is disposed in the second opening.

11 Claims, 8 Drawing Sheets

DISPLAY DEVICE

BACKGROUND OF THE DISCLOSURE

1. Field of the Disclosure

The present disclosure relates to a display device, and more particularly, to a display device with a transflective layer.

2. Description of the Prior Art

Display devices are types of output devices configured to convert acquired or stored electric information into visual information and display it to a user, and are used in various places such as homes, workplaces, or the like. With the advance of technology, in order to improve visual perception of the user and increase variety of image colors, light converting layers for reproducing different colors of lights by absorbing short-wavelength light are applied to the display device. However, light generated from the light converting layer disperses, such that light of one sub-pixel is easily leaked out and is guided to another sub-pixel, and accordingly interferes with light of the another sub-pixel, thereby deteriorating display quality of the display device.

SUMMARY OF THE DISCLOSURE

According to an embodiment, the present disclosure provides a display device including a light source, a substrate, a first transflective layer, a partition layer, a first light converting layer, and a second light converting layer. The substrate is disposed on the light source. The first transflective layer is disposed on the substrate and includes at least one hole. The partition layer is disposed on the first transflective layer, and the partition layer includes a first opening, a second opening, and a third opening overlapped with the at least one hole. The first light converting layer is disposed in the first opening, and the second light converting layer is disposed in the second opening. The hole and the third opening jointly form a step profile.

According to another embodiment, the present disclosure provides a display device including a light source, a substrate, a first transflective layer, a partition layer, a first light converting layer, and a second light converting layer. The substrate is disposed on the light source. The first transflective layer is disposed on the substrate and includes at least one hole. The partition layer is disposed between the light source and the substrate, and the partition layer includes a first opening, a second opening, and a third opening overlapped with the at least one hole. The first light converting layer is disposed in the first opening, and the second light converting layer is disposed in the second opening. The partition layer is in contact with the substrate.

According to another embodiment, the present disclosure provides a display device including a light source, a substrate, a first transflective layer, a partition layer, a first light converting layer, and a second light converting layer. The substrate is disposed on the light source. The first transflective layer is disposed on the substrate. The partition layer is disposed on the first transflective layer, and the partition layer comprising a first opening, a second opening, and a third opening. The first light converting layer is disposed in the first opening, and the second light converting layer is disposed in the second opening. A part of the first transflective layer is extended into the third opening in a normal direction of the display device.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
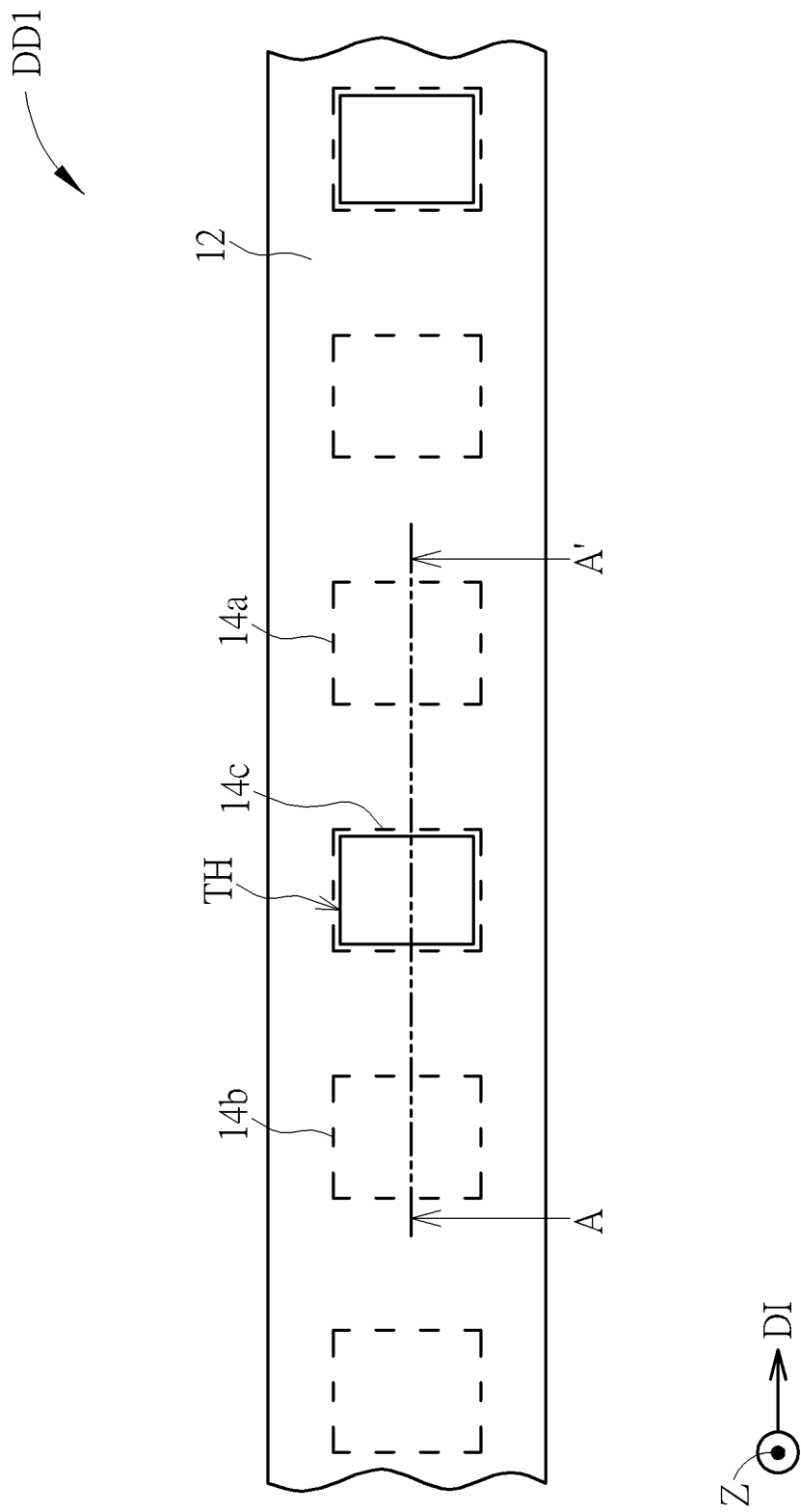
FIG. 1 is a schematic diagram illustrating a top view of a display device according to a first embodiment of the present disclosure.
Figure 2:
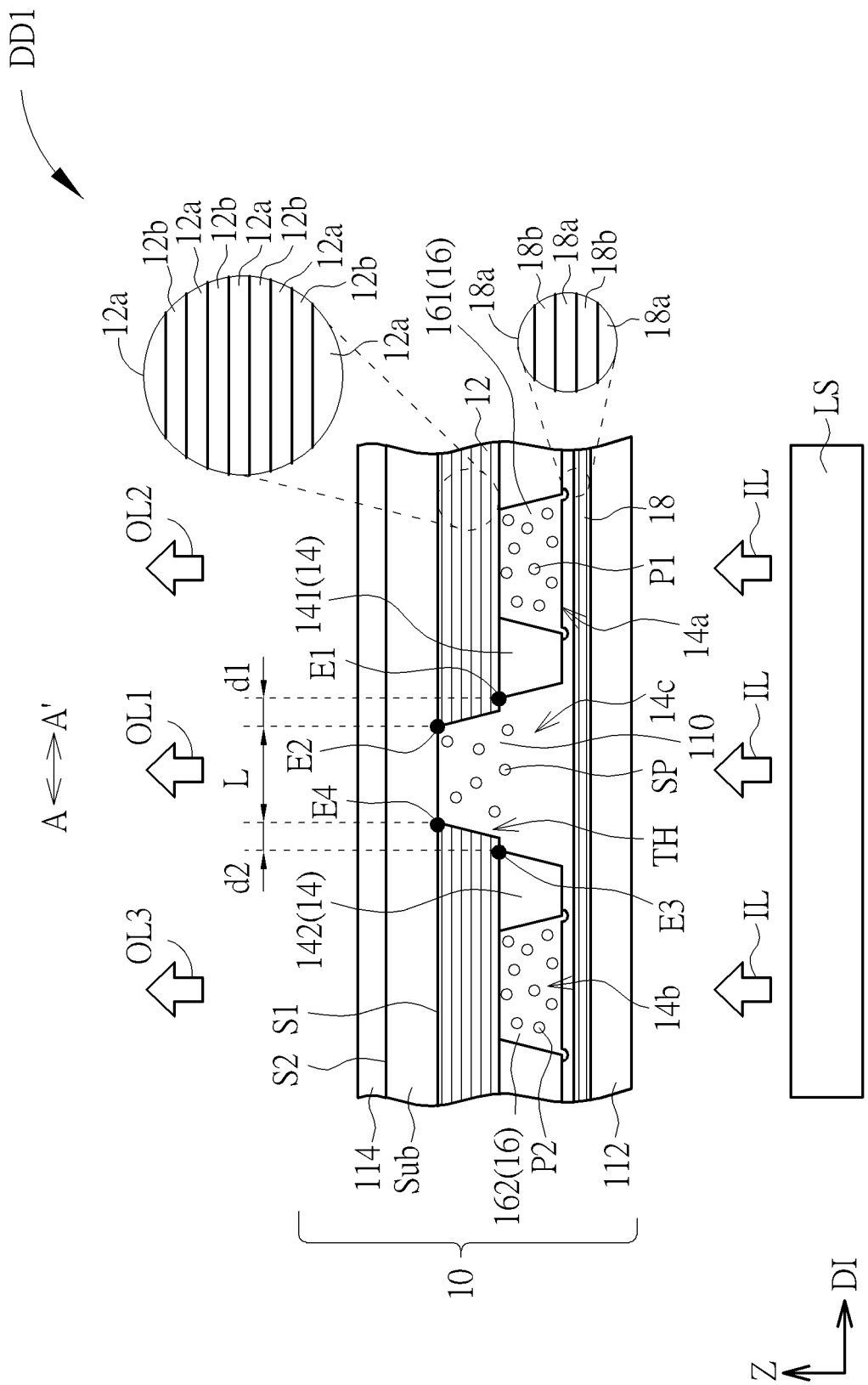
FIG. 2 is a schematic diagram illustrating a cross-sectional view of the display device taken along a line A-A' of FIG. 1.

Referring to FIG. 1 and FIG. 2, FIG. 1 is a schematic diagram illustrating a top view of a display device according to a first embodiment of the present disclosure, and FIG. 2 is a schematic diagram illustrating a cross-sectional view of the display device taken along a line A-A' of FIG. 1. The display device DD1 includes a light source LS and a cover substrate 10 disposed on the light source LS. The cover substrate 10 includes a substrate Sub, a first transflective layer 12, a partition layer 14, and a plurality of light converting layers 16, in which the substrate Sub is used for supporting the first transflective layer 12, the partition layer 14 and the light converting layers 16. The substrate Sub may for example include a hard substrate, such as a glass substrate, a plastic substrate, a quartz substrate or a sapphire substrate, or may be a flexible substrate, such as a polyimide (PI) substrate or a polyethylene terephthalate (PET) substrate, but not limited herein. In some embodiments, the substrate Sub may further include other required layers, such as a buffer layer on the hard substrate or the flexible substrate, but the present disclosure is not limited thereto. Also, the substrate Sub has a first surface S1 facing the light source LS and a second surface S2 opposite to the first surface S1.

The light source LS is used for generating an input light IL which is emitted toward the cover substrate 10, and the input light IL propagates in a direction substantially perpendicular to the first surface S1 of the substrate Sub. The type of the light source LS may be determined based on the type of the display device DD1. In this embodiment, the display device DD1 is a non-self-luminous display device. For example, the display device DD1 is a liquid crystal display (LCD) device, so the light source may be a backlight module may emit light with white color, but the present disclosure is not limited thereto. The backlight module may for example include at least one light emitting element and a light guide plate, in which the light emitting element may be for example a light emitting diode (LED), light inputted from the at least one light emitting element located on edge side of the light guide plate is guided by the light guide plate and outputted from light-exiting side, and it is called edge type backlight module. In other embodiment, the backlight module may for example include at least one light emitting element and without light guide plate, and it is called direct type backlight module. The backlight module may include a light converting layer located on the propagating path of the light from the light emitting element for converting the light of the light emitting element into the input light with desired color or spectrum. The light converting layer may comprise quantum dot material, phosphor material, fluorescent material, or other light converting materials. For example, the light converting layer may located on the light-exiting side of the light guide plate or directly located in the front of the light emitting element for adjusting the color or spectrum of the input light. Or, alternatively, in other embodiments, the backlight module may not include the light converting layer, and the color or spectrum of the input light IL from the backlight module may be close to that of the light from the light emitting element. The display device DD1 may further include a liquid crystal layer (not shown) and an array substrate (not shown) disposed between the cover substrate 10 and the light source LS, and the cover substrate 10, the liquid crystal layer and the array substrate can used for controlling the gray levels (or the light intensities) of different parts of the input light IL and may form a plurality of sub-pixels or pixels of the display device DD1.

In some embodiment, when the display device DD1 is a self-luminous display device, such as an organic light emitting diode (OLED) display device, an inorganic light emitting diode (LED) display device, or a quantum dot light emitting diode (QLED) display device, the light source LS may include a plurality of self-luminous light emitting elements (not shown) disposed on an array substrate (not shown) which is used for controlling and driving the light emitting elements. The light emitting elements may be for example an OLED, an LED, or a QLED. In such situation, the input light IL may be formed of a plurality of light beams respectively generated from the light emitting elements, and one of the light emitting elements may define one sub-pixel or one pixel of the display device DD1. In order that the light beams from the light emitting elements which form the input light IL have the same color, the light emitting elements may be identical to one another and have the same light emitting material, but the present disclosure is not limited herein. For the LED type light emitting elements, LED may be a chip with inorganic light emitting material for emitting light, for example the chip size of a mini-LED is in a range from 100 µm to 300 µm, the chip size of a micro-LED is in a range from 1 µm to 100 µm, or the chip size of a normal LED is in a range from 300 µm to 2 mm.

The first transflective layer 12 is disposed on the substrate Sub. In this embodiment, the first transflective layer 12 is formed on the first surface S1 of the substrate Sub, but the present disclosure is not limited thereto. The first transflective layer 12 is a reflector for reflecting light with wavelength in a first specific wavelength range, such as blue light wavelength range, and allowing light with wavelength outside the first specific wavelength range to penetrate through, for example the first transflective layer 12 may be a distributed Bragg reflector (DBR). In this embodiment, the wavelength of the input light IL generated from the light source LS may be in the first specific wavelength range, and the wavelengths of the lights generated from the light converting layers 16 are outside the first specific wavelength range, such that the first transflective layer 12 can reflect the input light IL from the light source LS and allow the lights from the light converting layers 16 to penetrate through. In order to allow part of the input light IL to serve as the first output light OL1 of one sub-pixel, the first transflective layer 12a includes at least one hole TH for allowing the input light IL generated from the light source LS to penetrate through. In this embodiment, the number of the hole TH may be plural.

Specifically, the first transflective layer 12 includes a plurality of first dielectric layers 12a and a plurality of second dielectric layers 12b, and the first dielectric layers 12a and the second dielectric layers 12b are alternately stacked on the substrate Sub. In some embodiments, the first dielectric layers 12a have a first refractive index, the second dielectric layers 12b have a second refractive index, and a difference between the first refractive index and the second refractive index is greater than or equal to 0.3. For example, the difference is in a range from 0.3 to 0.6. In this embodiment, the first refractive index is greater than the second refractive index. Or, alternatively, in other embodiments, the first refractive index may be less than the second refractive index. Furthermore, the number of the sum of the first dielectric layers 12a and the second dielectric layer 12b is about 15 or more, but the present disclosure is not limited thereto. At least one of the first dielectric layers 12a may include an element selected from the group consisting of silicon, aluminum and oxygen. For example, a material of one of the first dielectric layers 12a may include $SiO_2$, $SiO_X$:H, SiO, or $Al_2O_3$. At least one of the second dielectric layers 12b may include an element selected from the group consisting of Si, Ti, Zr, Nb, Ta, Ce, Y, Zn, O, and N. For example, a material of one of the second dielectric layers 12b may include $SiN_X$, $SiN_X$:H, $TiO_2$, $Ti_3O_5$, $Ti_2O_3$, TiO, $Ta_2O_5$, $ZrO_2$, $Nb_2O_5$, ZnO, $Y_2O_3$, or $CeO_2$. In some embodiments, the forming method of the first transflective layer 12 may include alternately forming a plurality of first dielectric material layers and a plurality of second dielectric material layers on the first surface S1 of the substrate Sub several times and followed by patterning the first dielectric material layers and the second dielectric material layers to form the hole TH. In some embodiments, a formed sidewall of the hole TH of the first transflective layer may be perpendicular or tilted to a surface of the first transflective layer 12 facing the substrate Sub or have a right angle or an acute included angle with this surface. The formed sidewall of the hole TH of the first transflective layer 12 may have a zigzag or roughness surface, but the present disclosure is not limited thereto. In some embodiments, the number of the first dielectric layers 12a and the number of the second dielectric layers 12b may be different or the same. In some embodiments, a thickness of the first dielectric layer 12a may be the same as or different from a thickness of the second dielectric layer 12b.

The partition layer 14 is disposed between the light source LS and the substrate Sub. In this embodiment, the partition layer 14 is disposed on the first transflective layer 12, such that the first transflective layer 12 is disposed between the partition layer 14 and the substrate Sub, and the partition layer 14 can be separated from the substrate Sub by the first transflective layer 12, but the present disclosure is not limited thereto. The partition layer 14 includes a plurality of openings for defining apertures of sub-pixels or pixels of the display device DD1 respectively, and the partition layer 14 may be formed of a light absorbing material, for example the light absorbing material may include a black photoresist material, black resin, or chromium. Accordingly, the partition layer 14 can absorb the light which propagates in an unwanted direction, thereby avoiding light beams from adjacent sub-pixels or adjacent pixels of the display device DD1 mixing or interfering with each other.

Specifically, the openings may include a plurality of first openings 14a, a plurality of second openings 14b and a plurality of third openings 14c, in which the first openings 14a and the second openings 14b expose the first transflective layer 12, and one of the third openings 14c is overlapped with one of the holes TH. That is the first transflective layer 12 covers the first openings 14a and the second opening 14b to prevent the input light IL emitted out from the first openings 14a and the second opening 14b. The first openings 14a, the second openings 14b and the third openings 14c may be arranged alternately in a direction DI, but the present disclosure is not limited thereto. For ease explanation, one of the first openings 14a, one of the second openings 14b and one of the third openings 14c between the first opening 14a and the second opening 14b are illustrated as an example, but the present disclosure is not limited thereto. One of the holes TH and the corresponding third opening 14c jointly form a step profile. In other words, a part of the first transflective layer 12 is extended into the third opening 14c in a normal direction Z of the display device DD1. For example, the normal direction Z is defined as a top view direction of the display device DD1 perpendicular to the first surface S1 of the substrate Sub. Since the first transflective layer 12 is extended into the third opening 14c, part of the input light IL emitted into the third opening 14c can be reflected by the part of the first transflective layer 12 extended into the third opening 14c, thereby reducing the part of the input light IL entering the first opening 14a and the second opening 14b. Accordingly, the light leakage and interfering between adjacent sub-pixels with different colors may be reduced and prevented.

It is noted that if a sidewall of the hole TH of the first transflective layer 12 is aligned to a sidewall of the third opening 14c and is exposed in the third opening 14c, part of the input light IL in the third opening 14c may enter the exposed edges of the first dielectric layers 12a and the second dielectric layers 12b and be guided to the adjacent first opening 14a or the adjacent second opening 14b by the first dielectric layers 12a and the second dielectric layers 12b. However, in this embodiment, the part of the first transflective layer 12 extended into the third opening 14c can reflect part of the input light IL which enters the exposed edges of the first dielectric layers 12a and the second dielectric layers 12b, so the part of the input light IL in the third opening 14c entering the first opening 14a and the second opening 14b can be effectively reduced, thereby preventing the light leakage and interfering between adjacent sub-pixels with different colors.

More specifically, the partition layer 14 includes a plurality of wall parts for separating the first openings 14a, the second openings 14b and the third openings 14c from one another. The wall parts include a first wall part 141 between the third opening 14c and the first opening 14a, and the first wall part 141 is separated from the substrate Sub by the first transflective layer 12. A surface of the first wall part 141 facing the substrate Sub has a first edge E1 adjacent to the third opening 14c, a surface of the first transflective layer 12 facing the substrate Sub has a second edge E2 in the hole TH and adjacent to the first edge E1 of the first wall part 141, a spacing between a projection of the first edge E1 of the first wall part 141 projected on the surface of the first transflective layer 12 in the normal direction Z of the display device DD1 and the second edge E2 of the first transflective layer 12 is defined as a first spacing d1, and the first spacing d1 is greater than 0 and less than or equal to 10 micrometers. Also, the partition layer 14 may further include a second wall part 142 between the third opening 14c and the second opening 14b, and the second wall part 142 is separated from the substrate Sub by the first transflective layer 12. A surface of the second wall part 142 facing the substrate Sub has a third edge E3 adjacent to the third opening 14c, the surface of the first transflective layer 12 facing the substrate Sub has a fourth edge E4 in the hole TH and adjacent to the third edge E3 of the second wall part 142, a spacing between a projection of the third edge E3 of the second wall part 142 projected on the surface of the first transflective layer 12 in the normal direction Z of the display device DD1 and the fourth edge E4 of the first transflective layer 12 is defined as a second spacing d2, and the second spacing d2 may also be greater than 0 and less than or equal to 10 micrometers, but the present disclosure is not limited thereto.

In this embodiment, the light converting layers 16 may include a first light converting layer 161 and a second light converting layer 162, in which the first light converting layer 161 is disposed in the first opening 14a, and the second light converting layer 162 is disposed in the second opening 14b. Specifically, the first light converting layer 161 may include a plurality of first light converting particles P1 for converting the input light IL into a first converted light, and the second light converting layer 162 may include a plurality of second light converting particles P2 for converting the input light IL into a second converted light. The input light IL, the first converted light and the second converted light may form a white light. Since the first transflective layer 12 covers the first opening 14a and the second opening 14b to prevent the input light IL from directly penetrating through, a second output light OL2 emitted out of apart of the first transflective layer 12 corresponding the first opening 14a is mainly formed of the first converted light, and a third output light OL3 emitted of a part of the first transflective layer 12 corresponding the second opening 14b is mainly formed of the second converted light. Thus, the first output light OL1, the second output light OL2 and the third output light OL3 may form the white light. For example, the first output light OL1 may be blue light, the second output light OL2 may be red light, and the third output light OL3 may be green light. The first light converting particles P1 and the second light converting particles P2 may include quantum dot material or phosphor material respectively. When the first light converting particles P1 and the second light converting particles P2 include a plurality of quantum dots, the quantum dots may be composed of a shell and a core disposed therein, the material of the core may include CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, or ZnO, and the material of the shell may include ZnS, CdS, ZnSe, CdSe, ZnTe, CdTe, PbS, TiO, SrSe, CdO, ZnO, InP, InS, GaP, GaN, GaO, InZnP, InGaP, InGaN, InZnSCdSe, or HgSe, but not limited thereto. For example, when the color of the second output light OL2 is red, the core size of the quantum dots of the first light converting layer 161 may be ranged from 4 nm to 6 nm, and when the color of the third output light OL3 is green, the core size of the quantum dots of the second light converting layer 162 may be 2.5 nm to 4.0 nm, but not limited thereto. In some embodiments, the color of the second output light OL2 and the color of the third output light OL3 may be exchanged or replaced by other colors.

In some embodiments, the first light converting layer 161 and the second light converting layer 162 may further include a plurality of light blocking particles (not shown) for preventing the input light IL from directly penetrating through the first light converting layer 161 and the second light converting layer 162, and the light blocking particles are used to absorb, reflect or scatter the input light IL in the first opening 14a and second opening 14b, such that the input light IL can be effectively converted by the first light converting particles P1 and the second light converting particles P2. Thus, the second output light OL2 can be formed of the first converted light as much as possible, and the third output light OL3 can be formed of the second converted light as much as possible. For example, the light blocking particles may include at least one of metal oxide (including metlloid oxide) and metal, in which the metal oxide may include $TiO_2$, $ZrO_2$, $Al_2O_3$, $In_2O_3$, ZnO, $SnO_2$, $Sb_2O_3$, $SiO_2$, or combinations thereof, and the metal may include Au, Ag, Cu, Pt, Fe, Co, Ni, Mn, or combinations thereof, but the present disclosure is not limited thereto.

In this embodiment, since the partition layer 14 is formed on the first transflective layer 12 before forming the light converting layers 16, a cross-sectional shape of the wall part may be reverse trapezoid, which means a surface size (area or cross-section width) of the wall part facing the first transflective layer 12 is greater than another surface size (area or cross-section width) of the wall part opposite to the surface facing the first transflective layer 12. For example, referring to FIG. 2, a cross-sectional shape of the first wall part 141 and a cross-sectional shape of the second wall part 142 are reverse trapezoid. Alternatively, in some embodiments, a cross-sectional shape of the wall part may be trapezoid. For example, referring to FIG. 3, the light converting layers 26 may be formed before forming the partition layer 24, so a surface size of first light converting layer 261 facing the first transflective layer 22 is greater than another surface size of first light converting layer 261 opposite to the surface facing the first transflective layer 22.

According to some embodiments, the cover substrate may optionally include a reflective layer (not shown) conformally on a surface of the partition layer 14 facing the light source LS. The reflective layer in the first opening 14a may be used to reflect the input light IL that is not absorbed yet to be absorbed by the first light converting particles P1 and reflect the dispersed first converted light toward the substrate Sub, such that the intensity of the second output light OL2 may be increased. Similarly, the reflective layer in the second opening 14b and the third opening 14c may be used to increase the intensity of the third output light OL3 and the intensity of the first output light OL1 respectively.

In this embodiment, the cover substrate 10 may further include a second transflective layer 18 disposed between the light source LS and the first light converting layer 161 and between the light source LS and the second light converting layer 162. The second transflective layer 18 is also a reflector for allowing light with wavelength in a second specific wavelength range to penetrate through and reflecting light with wavelength outside the second specific wavelength range, for example the second transflective layer 18 may also be a DBR. The second specific wavelength of the second transflective layer 18 may be for example the same as the first specific wavelength of the first transflective layer 12, such that the input light IL may penetrate through the second transflective layer 18 and into the first light converting layer 161 in the first opening 14a and the second light converting layer 162 in the second opening 14b, and the first converted light from the first light converting layer 161 and the second converted light from the second light converting layer 162 cannot pass through the second transflective layer 18. Accordingly, the first converted light generated from the first light converting layer 161 can be effectively directed toward the first transflective layer 12, and the first converted light can be used as the second output light OL2 as much as possible, thereby increasing the intensity of the second output light OL2. Similarly, the second converted light generated from the second light converting layer 162 can be effectively directed toward the first transflective layer 12, and the second converted light can be used as the third output light OL3 as much as possible, thereby increasing the intensity of the third output light OL3. In this embodiment, the second transflective layer 18 may cover the partition layer 14, the first openings 14a, the second opening 14b and the third opening 14c, but the present disclosure is not limited thereto.

Specifically, the second transflective layer 18 includes a plurality of third dielectric layers 18a and a plurality of fourth dielectric layers 18b, and the third dielectric layers 18a and the fourth dielectric layers 18b are alternately stacked on the first light converting layer 161 and the second light converting layer 162. In some embodiments, the third dielectric layers 18a have a third refractive index, the fourth dielectric layers 18b have a fourth refractive index, and a difference between the third refractive index and the fourth refractive index is greater than or equal to 0.3. For example, the third refractive index is greater than the fourth refractive index. Or, alternatively, the third refractive index may be less than the fourth refractive index. Furthermore, of the first transflective layer is greater than a thickness of the second transflective layer. For example, when a thickness of the third dielectric layer 18a and a thickness of the fourth dielectric layer 18b are the same as the thickness of the first dielectric layer 12a and the thickness of the second dielectric layer 12b, the number of the sum of the third dielectric layers 18a and the fourth dielectric layer 18b may be less than the number of the sum of the first dielectric layers 12a and the second dielectric layer 12b. At least one of the third dielectric layers 18a may include an element selected from the group consisting of silicon, aluminum and oxygen. For example, a material of one of the third dielectric layers 18a may include $SiO_2$, $SiO_x$:H, SiO, or $Al_2O_3$. At least one of the fourth dielectric layers 18b may include an element selected from the group consisting of Si, Ti, Zr, Nb, Ta, Ce, Y, Zn, O, and N. For example, a material of one of the fourth dielectric layers 18b may include $SiN_x$, $SiN_x$:H, $TiO_2$, $Ti_3O_5$, $Ti_2O_3$, TiO, $Ta_2O_5$, $ZrO_2$, $Nb_2O_5$, ZnO, $Y_2O_3$, or $CeO_2$.

It is notable that since the first transflective layer 12 can reflect the input light IL from the light source LS and allow the first converted light and the second converted light to penetrate through, the input light IL can be effectively dispersed in the first opening 14a and the second opening 14b and be absorbed by the first light converting particles P1 and the second light converting particles P2 as much as possible. Also, since the second transflective layer 18 can reflect the first converted light and the second converted light and allow the input light IL to penetrate through, the loss of the first converted light and the second converted light emitted out of the second transflective layer 18 will be reduced. In some embodiments, the cover substrate 10 may not include the second transflective layer 18.

In this embodiment, the cover substrate 10 may further include a filling layer 110. The filling layer 110 may fill up the hole TH and the corresponding third opening 14c and cover the first light converting layer 161 and the second light converting layer 162, so the filling layer 110 may be disposed between the second transflective layer 18 and the first light converting layer 161 and between the second transflective layer 18 and the second light converting layer 162. Specifically, a surface of the filling layer 110 facing the second transflective layer 18 may be planar, such that the second transflective layer 18 may be planar. With this design, the input light IL can be ensured to enter the second transflective layer 18 vertically, so the second transflective layer 18 can be guaranteed to operated normally.

In this embodiment, the cover substrate 10 may further include a polarizer 112 disposed on the second transflective layer 18 and another polarizer (not shown). The liquid crystal layer is disposed between the polarizer 112 and the another polarizer, and the light converting layer 16 is not disposed between the polarizer 112 and another polarizer so as to prevent from depolarizing the polarized light. The another polarizer may be for example disposed between the array substrate and the light source LS. When the polarized light is absorbed by the light converting layers 16 and converted into a converted light, the converted light will not have polarization of the polarized light, which means the light converting layers 16 will deteriorate the polarization of light. For this reason, the polarizer 112 of this embodiment is disposed between the light converting layers 16 and the liquid crystal layer to ensure that the optical function of the display device DD1 is regular. For example, the polarizer 112 may be a normal polarizer or be formed of wire grids and be a wire grid polarizer.

In some embodiments, the cover substrate 10 may optionally further include an antireflection film 114 (could be a circular polarizer or other types of antireflection films) disposed on the second surface S2 of the substrate Sub for reducing the affection of ambient light.

In some embodiments, since the first output light OL1 is directly formed of the input light IL, as compared with the second output light OL2 formed of the first converted light and the third output light OL3 formed of the second converted light, the intensity of the first output light OL1 may be too large such that the white light formed by mixing the first output light OL1, the second output light OL2 and the third output light OL3 is bluish. The cover substrate 10 may optionally further include a plurality of light scattering particles SP (a type of light blocking particles) in the filling layer 110 and in the hole TH for reducing amount of the input light IL constituting the first output light OL1. The intensity of the first output light OL1 may be adjusted to match the intensity of the second output light OL2 and the intensity of the third output light OL3, such that the formed white light can have a color close to or equal to the white color at a color temperature of 6500K. The light scattering particles SP may be the same as the light blocking particles in the first light converting layer 161 and the second light converting layer 162, but the present disclosure is not limited thereto. Alternatively, in some embodiments, the light scattering particles SP may be in the third opening 14c, or further dispersed between each light converting layer 16 and the second transflective layer 18. In some embodiments, the cover substrate Sub may not include the light scattering particles SP in the third openings 14c.

The method for adjusting the intensity of the first output light OL1 to form a purer white light is not limited to the above-mentioned design of the light scattering particles SP. In some embodiments, a width of the part of the first transflective layer overlapping the third opening 14c in the normal direction Z may be adjusted to alter the intensity of the first output light OL1. Specifically, referring to FIG. 2, a ratio of a width of the hole TH in the direction DI to a sum of the width of the hole TH, the first spacing d1 and the second spacing d2 is greater than or equal to 0.2 and less than 1.

Figure 3:
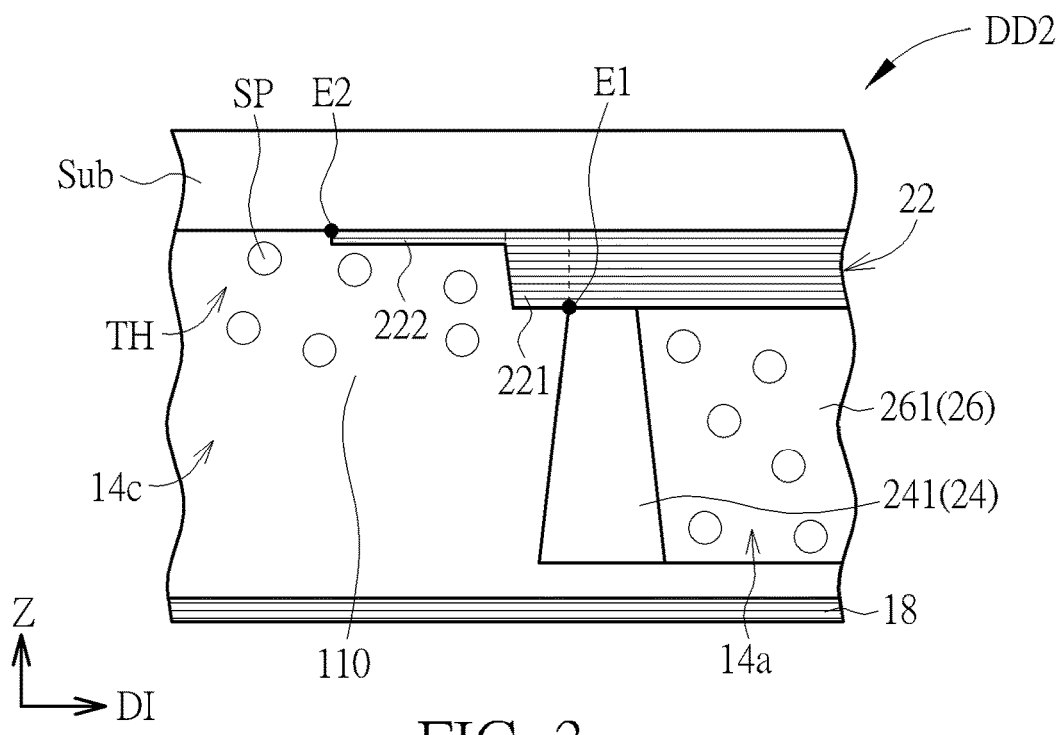
FIG. 3 is a schematic diagram illustrating a cross-sectional view of a part of a display device corresponding to the third opening according to a first variant embodiment of the first embodiment of the present disclosure.

Refer to FIG. 3, which is a schematic diagram illustrating a cross-sectional view of a part of a display device corresponding to the third opening according to a first variant embodiment of the first embodiment of the present disclosure. In the display device DD2 of this variant embodiment, the part the first transflective layer 22 extending into the third opening 14c may include a first part 221 and a second part 222 connected to the first part 221, in which the first part 221 and the second part 222 are overlapped with the third opening 14c, and a thickness of the first part 221 is greater than a thickness of the second part 222. Specifically, the first part 221 is disposed between the second part 222 and the first wall part 241 and may be defined as being in a region from the first edge E1 to a boundary between the first part 221 and the second part 222. The second part 222 may be defined as being in a region from the boundary between the first part 221 and the second part 222 to the second edge E2. Since the thickness of the second part 222 is less than the thickness of the first part 221, the input light IL may partially penetrate through the second part 222, and thus, through adjusting a length of the second part 122 in the direction DI, the intensity of the first output light OL1 can be altered to match the intensity of the second output light OL2 and the intensity of the third output light OL3 so as to form a purer white light. In some embodiments, the second part 222 may optionally extend to cover the hole TH.

Figure 4:
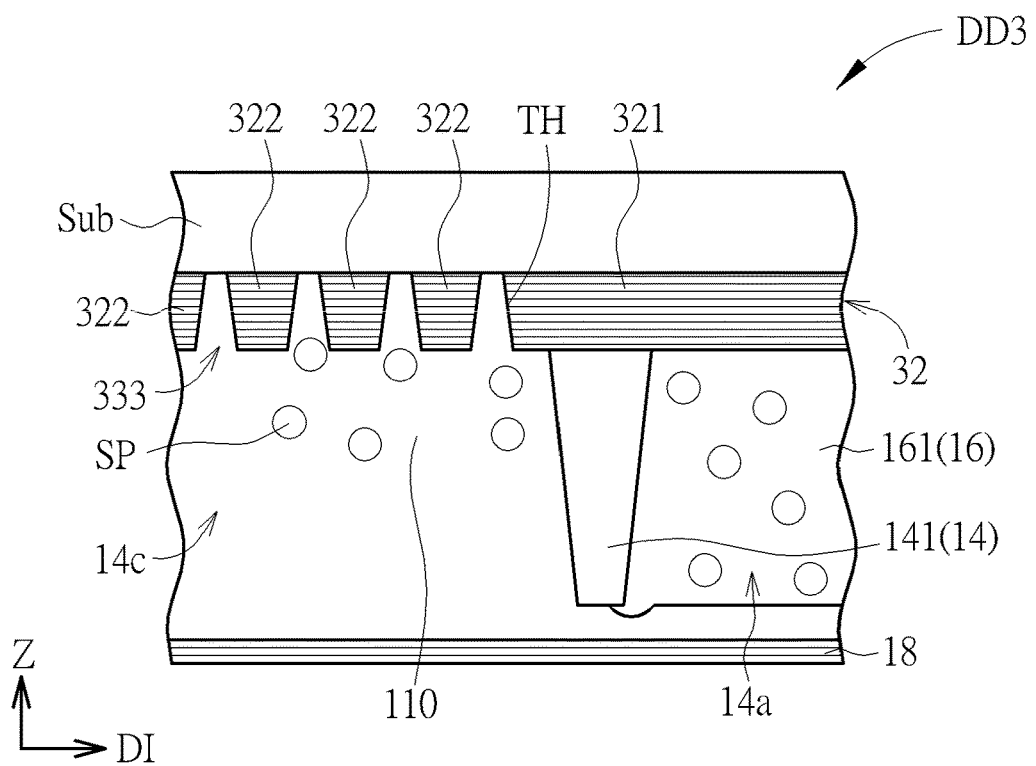
FIG. 4 is a schematic diagram illustrating a cross-sectional view of a part of a display device corresponding to the third opening according to a second variant embodiment of the first embodiment of the present disclosure.

Refer to FIG. 4, which is a schematic diagram illustrating a cross-sectional view of a part of a display device corresponding to the third opening according to a second variant embodiment of the first embodiment of the present disclosure. In the display device DD3 of this variant embodiment, the first transflective layer 32 includes a main body 321 and a plurality of separate parts 322. The main body 321 may be the same the first transflective layer 12, so the main body 321 has the hole TH and covers the first opening 14a and the second opening 14b, and the main body 321 is extended into the third opening 14c in the normal direction Z. The separate parts 322 are disposed in the hole TH and separated from each other, and the separate parts 322 are separated from the main body 321. An opening 333 may exist between any two adjacent separate parts 322. In this variant embodiment, a thickness of the main body 321 may be the same as a thickness of each separate part 322, but the present disclosure is not limited thereto. In some embodiments, the thickness of the main body 321 may be different from the thickness of each separate part 322, for example greater than the thickness of each separate part 322. Through the separate parts 322, a part of the hole TH can be shielded, and the intensity of the input light IL penetrating through the first transflective layer 32 may be reduced. Thus, through adjusting the sum of the areas of the openings 333, the intensity of the first output light OL1 can be altered to match the intensity of the second output light OL2 and the intensity of the third output light OL3 so as to form a purer white light.

Figure 5:
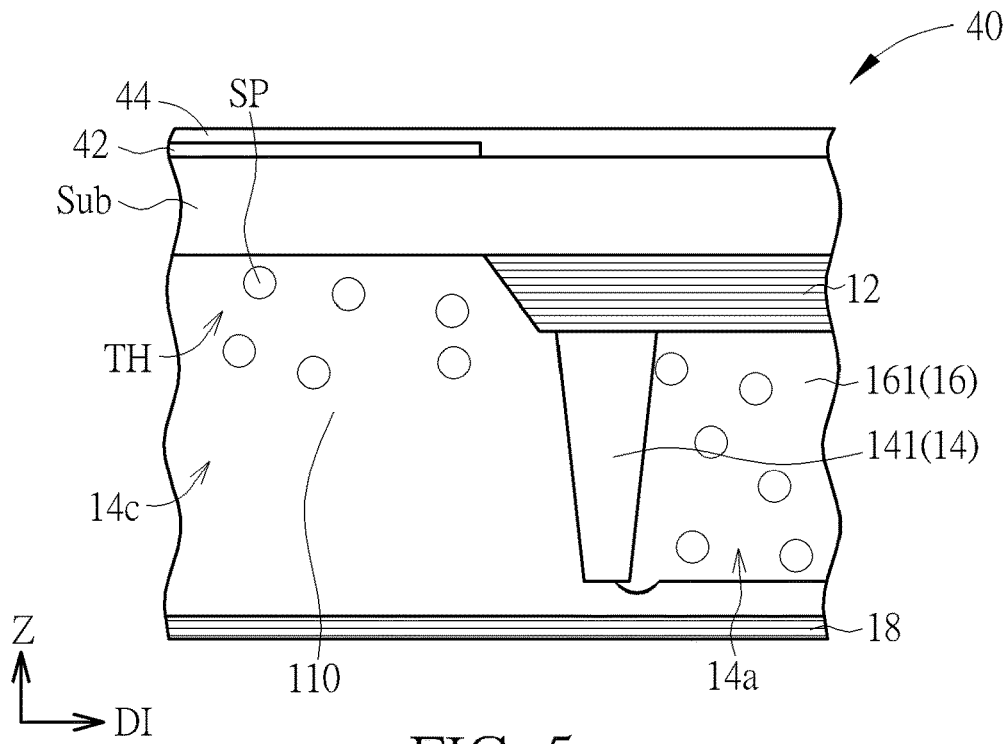
FIG. 5 is a schematic diagram illustrating a cross-sectional view of a part of a display device corresponding to the third opening according to a third variant embodiment of the first embodiment of the present disclosure.

Refer to FIG. 5, which is a schematic diagram illustrating a cross-sectional view of a part of a display device corresponding to the third opening according to a third variant embodiment of the first embodiment of the present disclosure. In the display device DD4 of this variant embodiment, the cover substrate 40 may further include a capping layer 42 disposed on the second surface S2 of the substrate Sub and overlapped with the hole TH. The capping layer 42 is used to absorb a part of the input light IL penetrating through the capping layer 42. Specifically, the capping layer 42 may partially or fully cover the third opening 14c, so that the intensity of the input light IL penetrating through the capping layer 42 may be reduced. Thus, through adjusting the thickness of the capping layer 42 or the overlapping area of the capping layer 42 and the third opening 14c, the intensity of the first output light OL1 can be altered to match the intensity of the second output light OL2 and the intensity of the third output light OL3 so as to form a purer white light. In some embodiment, the cover substrate 40 may further include a protection layer 44 disposed on the capping layer 42 for protecting the capping layer 42. The protection layer 44 may be the antireflection film 114 of the first embodiment or other film.

Figure 6:
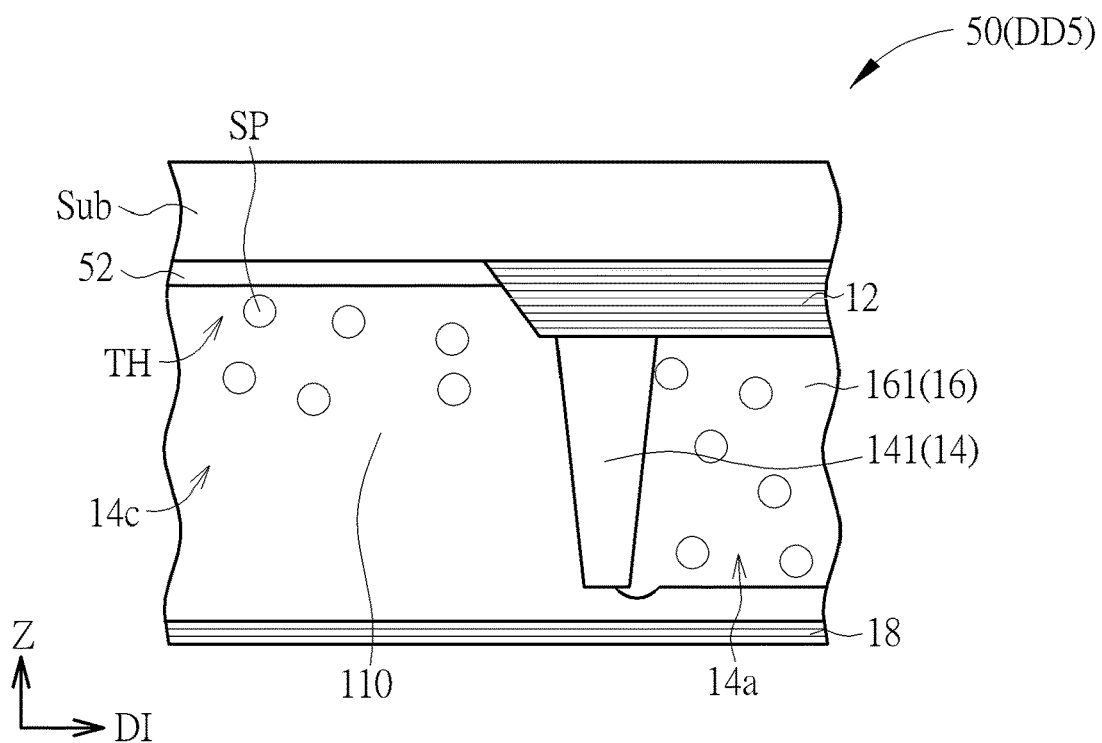
FIG. 6 is a schematic diagram illustrating a cross-sectional view of a part of a display device corresponding to the third opening according to a fourth variant embodiment of the first embodiment of the present disclosure.

Refer to FIG. 6, which is a schematic diagram illustrating a cross-sectional view of a part of a display device corresponding to the third opening according to a fourth variant embodiment of the first embodiment of the present disclosure. In the display device DD5 of this variant embodiment, the cover substrate 50 may further include a yellow color filter layer disposed on the substrate Sub and overlapped with the hole TH. The yellow color filter layer 52 is used to filter a part of the input light IL penetrating through the yellow color filter layer 52. Thus, through adjusting the thickness of the yellow color filter layer 52 or the overlapping area of the yellow color filter layer 52 and the third opening 14c, the intensity of the first output light OL1 can be altered to match the intensity of the second output light OL2 and the intensity of the third output light OL3 so as to form a purer white light. In this variant embodiment, the yellow color filter layer 52 may be disposed on the first surface S1 of the substrate Sub and in the hole TH. For example, the yellow color filter layer 52 may further cover the hole TH, but the present disclosure is not limited thereto. In some embodiments, the yellow color filter layer 52 may be disposed on the second surface S2 of the substrate Sub.

In some embodiments, the method for adjusting the intensity of the first output light OL1 to balance the intensities of the first output light OL1, the second output light OL2 and the third output light OL3 to form a purer white light may combine at least two of the technical features in the above-mentioned embodiment and variant embodiments.

Figure 7:
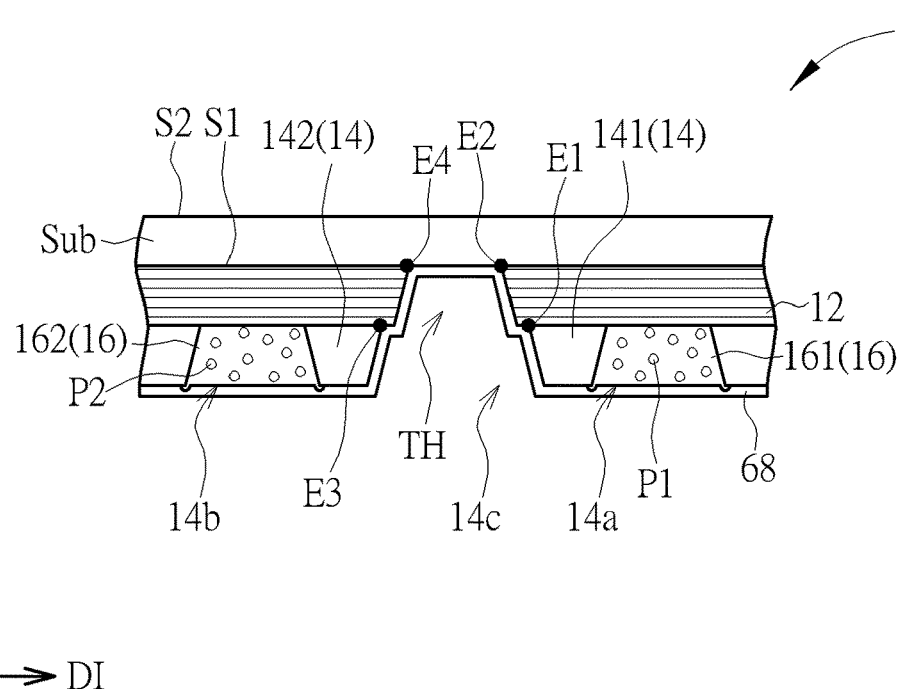
FIG. 7 is a schematic diagram illustrating a cross-sectional view of a display device according to a fifth variant embodiment of the first embodiment of the present disclosure.

The structure of the filling layer of the present disclosure is not limited to the above-mentioned embodiments and variant embodiments. Refer to FIG. 7, which is a schematic diagram illustrating a cross-sectional view of a display device according to a fifth variant embodiment of the first embodiment of the present disclosure. In the display device DD6 of this variant embodiment, the cover substrate 60 may not include the filling layer. In such situation, the second transflective layer 68 may be directly formed on the light converting layers 16 and the partition layer 14 and extend into the hole TH and the third opening 14c to be in contact with the first surface S1 of the substrate Sub.

Figure 8:
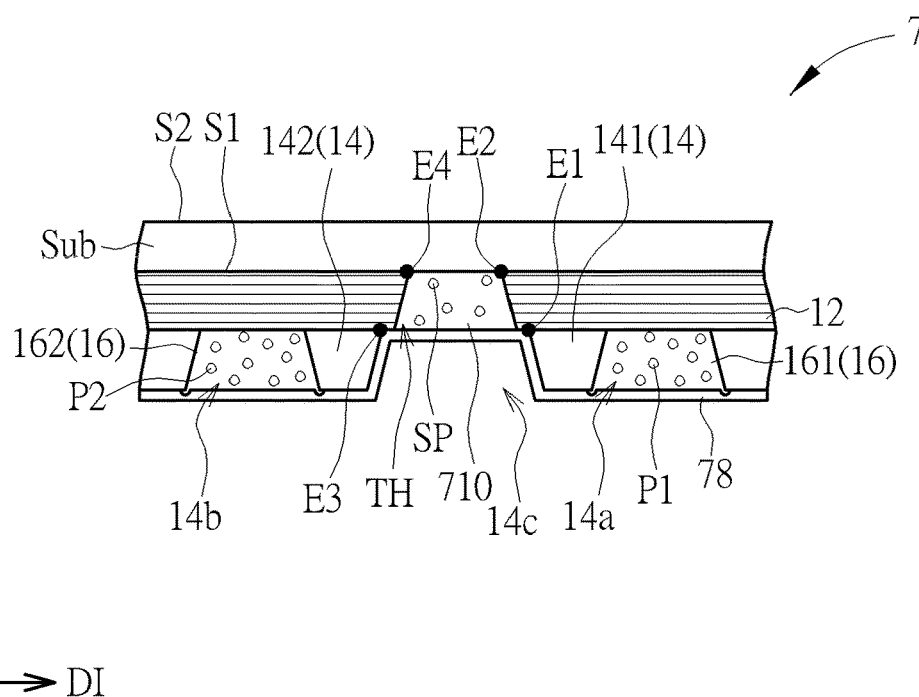
FIG. 8 is a schematic diagram illustrating a cross-sectional view of a display device according to a sixth variant embodiment of the first embodiment of the present disclosure.

Refer to FIG. 8, which is a schematic diagram illustrating a cross-sectional view of a display device according to a sixth variant embodiment of the first embodiment of the present disclosure. A difference between the display device DD7 of this variant embodiment and the display device DD6 of the fifth variant embodiment, the cover substrate 70 include the filling layer 710, and the filling layer 710 is disposed in the hole TH. For example, the filling layer 710 fills up the hole TH. In such situation, the second transflective layer 78 may extend into the third opening 14c to be in contact with the filling layer 710.

Figure 9:
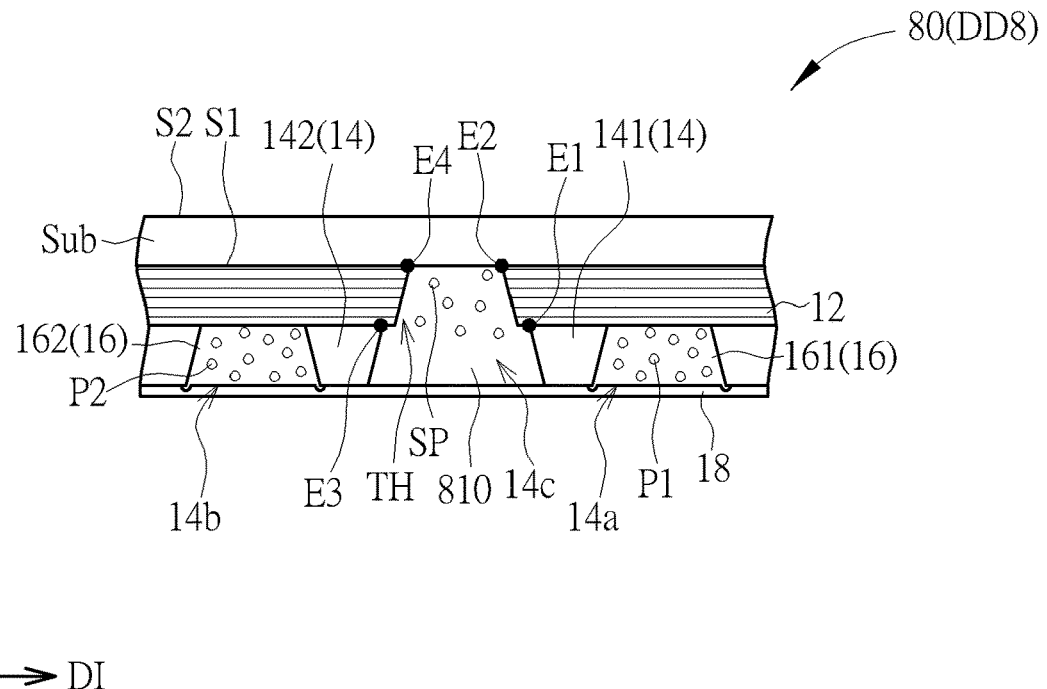
FIG. 9 is a schematic diagram illustrating a cross-sectional view of a display device according to a seventh variant embodiment of the first embodiment of the present disclosure.

Refer to FIG. 9, which is a schematic diagram illustrating a cross-sectional view of a display device according to a seventh variant embodiment of the first embodiment of the present disclosure. A difference between the display device DD8 of this variant embodiment and the display device DD7 of the sixth variant embodiment, the filling layer 810 is further disposed in the third opening 14c. For example, the filling layer 810 fills up the third opening 14c.

The display device of the present disclosure is not limited to the above embodiment. Further embodiments of the present disclosure are described below. To compare the embodiments conveniently and simplify the description, the same component would be labeled with the same symbol in the following. The following description will detail the dissimilarities among different embodiments and the identical features will not be redundantly described.

Figure 10:
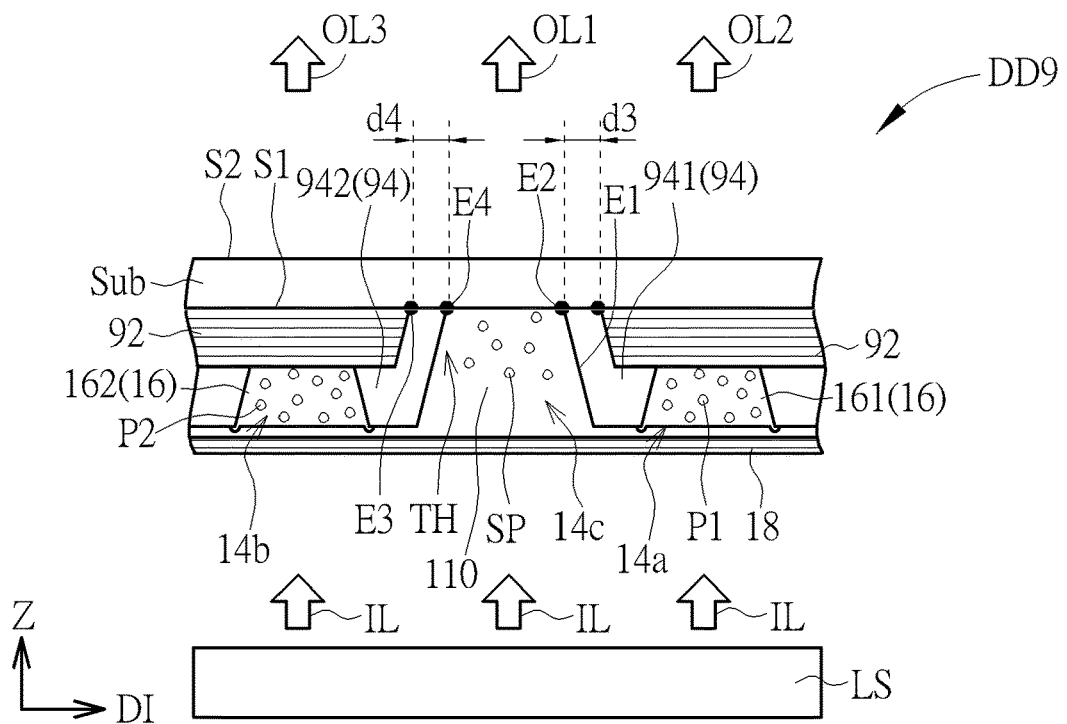
FIG. 10 is a schematic diagram illustrating a cross-sectional view of a display device according to a second embodiment of the present disclosure.

Refer to FIG. 10, which is a schematic diagram illustrating a cross-sectional view of a display device according to a second embodiment of the present disclosure. A difference between the display device DD9 of the second embodiment and the display device DD1 of the first embodiment is that the second edge E2 of the first transflective layer 92 is covered with the partition layer 94 and the fourth edge E4 of the first transflective layer 92 is covered with the partition layer 94. Specifically, the first wall part 941 covers a sidewall of the hole TH of the first transflective layer 92 with the second edge E2, so the first wall part 941 extends to be in contact with the substrate Sub. Also, the second wall part 942 covers a sidewall of the hole TH of the first transflective layer 92 with the fourth edge E4, so the second wall part 942 extends to be in contact with the substrate Sub. In other words, a width of the third opening 14c in the direction DI is less than a width of the hole TH. Because the sidewalls of the hole TH of the first transflective layer 92 are not exposed in the third opening 14c, and the first wall part 641 and the second wall part 942 are in contact with the substrate, the input light IL in the third opening 14c will not enter the first opening 14a and the second opening 14b through the first transflective layer 92, and when the input light IL is emitted onto the partition layer 94, the part of the input light IL will be absorbed by the partition layer 64. For this reason, the light leakage and interfering between adjacent sub-pixels with different colors may be reduced. Or, alternatively, in some embodiment, the display device DD9 may further include a reflection layer on the partition layer 94, the part of the input light IL may be reflected by the reflection layer.

In this embodiment, the first spacing d3 between the first edge E1 of the first wall part 941 and the second edge E2 of the first transflective layer 92 is greater than 0 and less than or equal to 10 micrometers. The second spacing d4 between the third edge E3 of the second wall part 942 and the fourth edge E4 of the first transflective layer 92 is also greater than 0 and less than or equal to 10 micrometers.

In some embodiments, the display device DD9 may further include at least one of the technical features in the first embodiment and its variant embodiments to adjust the intensity of the first output light OL1 to balance the intensities of the first output light OL1, the second output light OL2 and the third output light OL3 to form a purer white light.

In this embodiment, a cross-sectional shape of the first wall part 941 and a cross-sectional shape of the second wall part 942 are reverse trapezoid. Alternatively, in some embodiments, a cross-sectional shape of the first wall part 941 and a cross-sectional shape of the second wall part 942 may be trapezoid.

Figure 11:
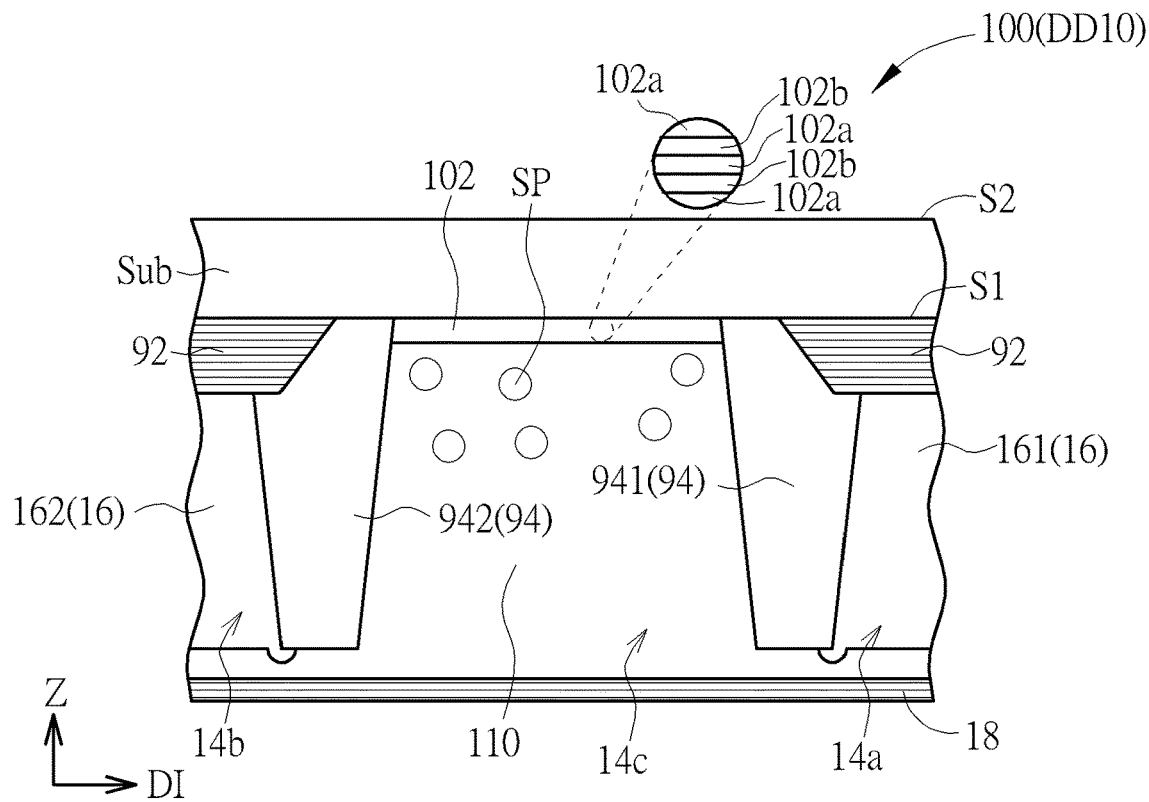
FIG. 11 is a schematic diagram illustrating a cross-sectional view of a display device according to a variant embodiment of the second embodiment of the present disclosure.

Refer to FIG. 11, which is a schematic diagram illustrating a cross-sectional view of a display device according to a variant embodiment of the second embodiment of the present disclosure. In the display device DD10 of this variant embodiment, the cover substrate 100 may further include a third transflective layer 102 in the third opening 14c, and a thickness of the third transflective layer 102 is less than the thickness of the second transflective layer 18. Since that, the input light IL may partially penetrate through the third transflective layer 102, and thus, through adjusting the thickness of the third transflective layer 102, the intensity of the first output light OL1 can be altered to match the intensity of the second output light OL2 and the intensity of the third output light OL3 so as to form a purer white light. In this embodiment, the third transflective layer 102 may include a plurality of fifth dielectric layers 102a and a plurality of sixth dielectric layers 102b, and the fifth dielectric layers 102a and the sixth dielectric layers 102b are alternately stacked on the first surface S1 of the substrate Sub. For example, the number of the sum of the fifth dielectric layers 102a and the sixth dielectric layer 102b is less than the number of the sum of the third dielectric layers 18a and the fourth dielectric layer 18b. At least one of the fifth dielectric layers 102a may include an element selected from the group consisting of silicon, aluminum and oxygen. For example, a material of one of the fifth dielectric layers 102a may include $SiO_2$, $SiO_X$:H, SiO, or $Al_2O_3$. At least one of the sixth dielectric layers 102b may include an element selected from the group consisting of Si, Ti, Zr, Nb, Ta, Ce, Y, Zn, O, and N. For example, a material of one of the sixth dielectric layers 102b may include $SiN_X$, $SiN_X$:H, $TiO_2$, $Ti_3O_5$, $Ti_2O_3$, TiO, $Ta_2O_5$, $ZrO_2$, $Nb_2O_5$, ZnO, $Y_2O_3$, or $CeO_2$.

Figure 12:
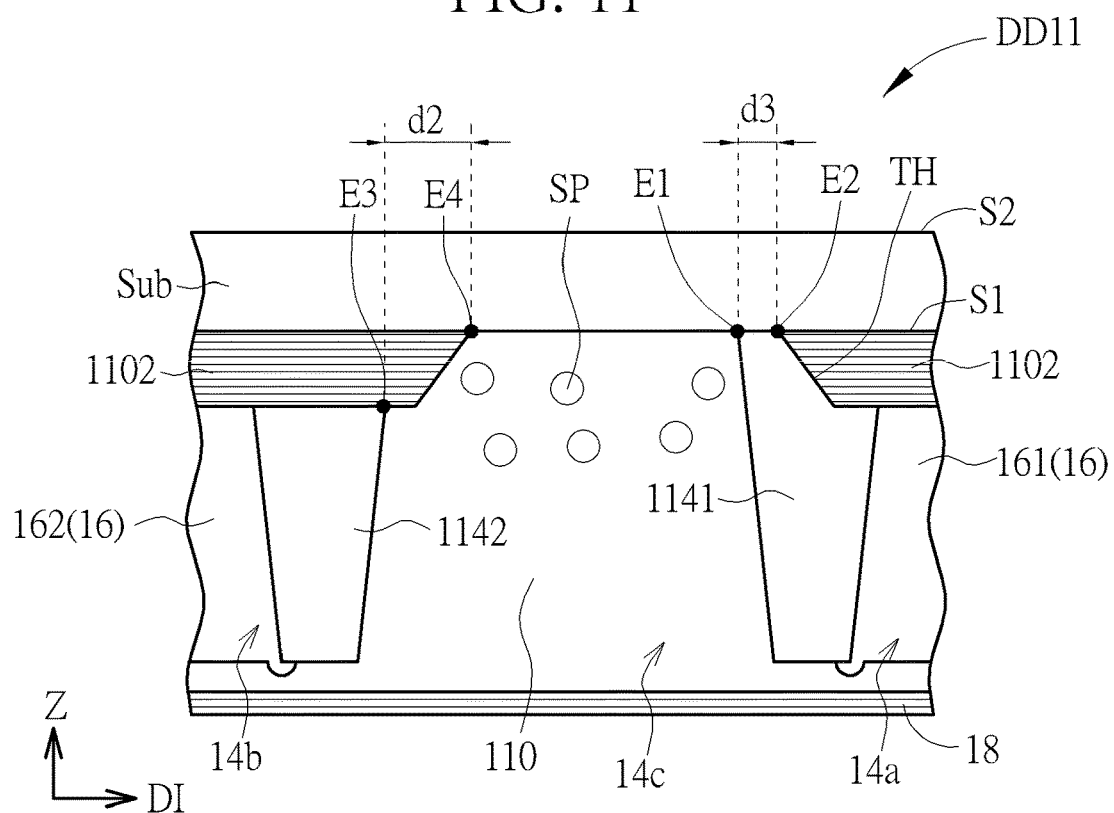
FIG. 12 is a schematic diagram illustrating a cross-sectional view of a display device according to a third embodiment of the present disclosure.

Refer to FIG. 12, which is a schematic diagram illustrating a cross-sectional view of a display device according to a third embodiment of the present disclosure. A difference between the display device DD11 of the third embodiment and the display device DD2 of the second embodiment is that the second wall part 1142 of this embodiment is disposed on the first surface S1 of the substrate Sub and separated from the substrate Sub by the first transflective layer 1102. In other words, the combined structure of the second wall part 1142 and a part of the first transflective layer 1102 corresponding to the second wall part 1142 may be the same as the combined structure of the second wall part 142 and the part of the first transflective layer 12 corresponding to the second wall part 142 of the first embodiment, and the combined structure of the first wall part 1141 and a part of the first transflective layer 1102 corresponding to the first wall part 1141 may be the same as the combined structure of the first wall part 641 and the part of the first transflective layer 62 corresponding to the first wall part 641 of the second embodiment.

In this embodiment, a cross-sectional shape of the first wall part 1141 and a cross-sectional shape of the second wall part 1142 are reverse trapezoid. Alternatively, in some embodiments, a cross-sectional shape of the first wall part 1141 and a cross-sectional shape of the second wall part 1142 may be trapezoid.

In some embodiments, the combined structure of the second wall part 1142 and a part of the first transflective layer 1102 corresponding to the second wall part 1142 and the combined structure of the first wall part 1141 and a part of the first transflective layer 1102 corresponding to the first wall part 1141 may be exchanged.

In some embodiments, the display device may further include at least one of the technical features in the first embodiment and its variant embodiments to adjust the intensity of the first output light OL1 to balance the intensities of the first output light OL1, the second output light OL2 and the third output light OL3 to form a purer white light.

Figure 13:
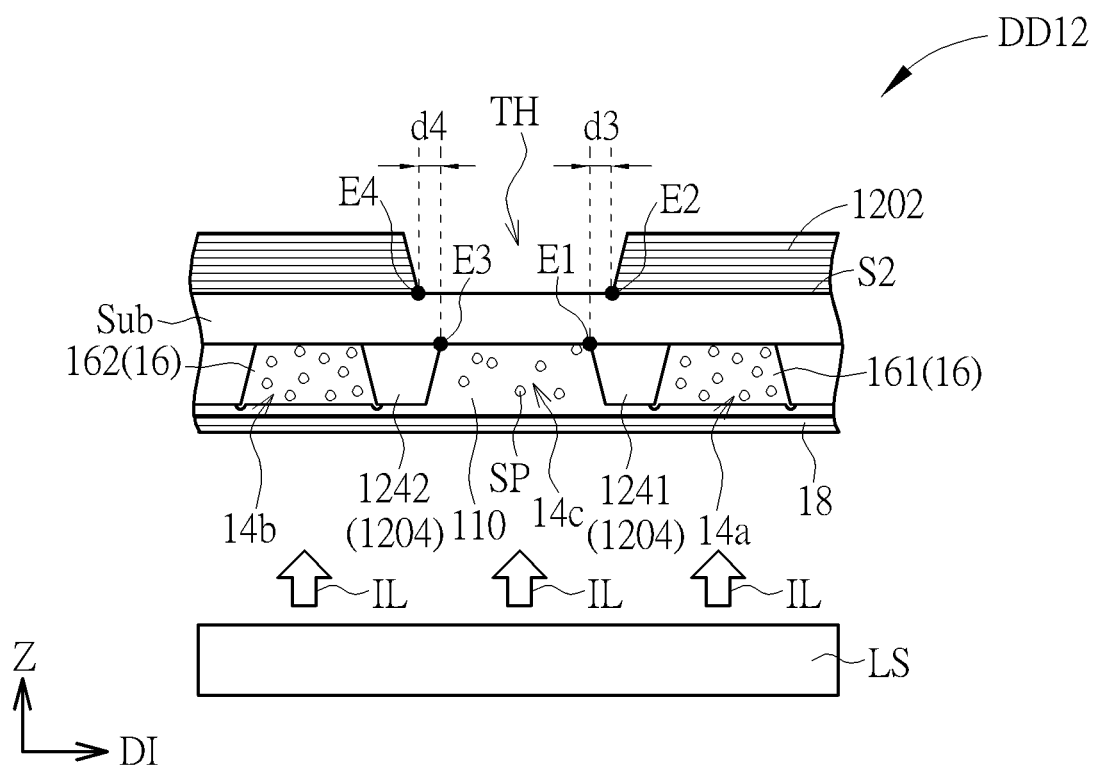
FIG. 13 is a schematic diagram illustrating a cross-sectional view of a display device according to a fourth embodiment of the present disclosure.

Refer to FIG. 13, which is a schematic diagram illustrating a cross-sectional view of a display device according to a fourth embodiment of the present disclosure. A difference between the display device DD12 of this embodiment and the display device DD6 of the second embodiment is that the first transflective layer 1202 of this embodiment is disposed on the second surface S2 of the substrate Sub. Because that, the partition layer 1204 is in contact with the first surface S1 of the substrate Sub. In this embodiment, the first spacing d3 between the first edge E1 of the first wall part 1241 and the second edge E2 of the first transflective layer 1202 is greater than 0 and less than or equal to 10 micrometers, and the second spacing d4 between the third edge E3 of the second wall part 1242 and the fourth edge E4 of the first transflective layer 1202 is also greater than 0 and less than or equal to 10 micrometers. In this embodiment, the display device DD12 may not include the second transflective layer.

In this embodiment, a cross-sectional shape of the first wall part 1241 and a cross-sectional shape of the second wall part 1242 are reverse trapezoid. Alternatively, in some embodiments, a cross-sectional shape of the first wall part 1241 and a cross-sectional shape of the second wall part 1242 may be trapezoid.

In some embodiments, the display device may further include at least one of the technical features in the first embodiment and its variant embodiments to adjust the intensity of the first output light OL1 to balance the intensities of the first output light OL1, the second output light OL2 and the third output light OL3 to form a purer white light.

As the mentioned above, in the present disclosure, the first transflective layer is extended into the third opening, or the partition layer covers the sidewall of the hole of the first transflective layer, such that part of the input light emitted into the third opening can be reflected by the part of the first transflective layer extended into the third opening or absorbed by the partition layer. Accordingly, the part of the input light entering the first opening and the second opening 14b can reduced or prevented, and the light leakage and interfering between adjacent sub-pixels with different colors can be reduced or prevented.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
   a light source;
   a substrate disposed on the light source;
   a first transflective layer disposed on the substrate and comprising at least one hole;
   a partition layer disposed on the first transflective layer, the partition layer comprising a first opening, a second opening, and a third opening overlapped with the at least one hole;
   a first light converting layer disposed in the first opening;
   a second light converting layer disposed in the second opening; and
   a second transflective layer disposed between the light source and the first light converting layer and between the light source and the second light converting layer,
   wherein the at least one hole and the third opening jointly form a step profile and a thickness of the first transflective layer is greater than a thickness of the second transflective layer.

2. The display device of claim 1, further comprising a filling layer disposed in the hole.

3. The display device of claim 1, wherein the first transflective layer comprises a plurality of first dielectric layers and a plurality of second dielectric layers alternately stacked on the substrate, and
   wherein the first dielectric layers comprise a first refractive index, the second dielectric layers comprise a second refractive index, and a difference between the first refractive index and the second refractive index is greater than or equal to 0.3.

4. The display device of claim 1, wherein the partition layer comprises a first wall part between the third opening and the first opening, the first wall part is separated from the substrate by the first transflective layer, a surface of the first wall part facing the substrate has a first edge adjacent to the third opening, a surface of the first transflective layer facing the substrate has a second edge adjacent to the first edge, a spacing between a projection of the first edge projected on the surface of the first transflective layer in a normal direction of the display device and the second edge is defined as a first spacing, and the first spacing is greater than 0 and less than or equal to 10 micrometers.

5. The display device of claim 1, further comprising a plurality of light scattering particles disposed in the hole.

6. A display device, comprising:
   a light source;
   a substrate disposed on the light source;
   a first transflective layer disposed on the substrate;
   a partition layer disposed on the first transflective layer, and the partition layer comprising a first opening, a second opening, and a third opening;
   a first light converting layer disposed in the first opening;
   a second light converting layer disposed in the second opening; and
   a second transflective layer disposed between the light source and the first light converting layer and between the light source and the second light converting layer,
   wherein a part of the first transflective layer is extended into the third opening in a normal direction of the display device, and a thickness of the first transflective layer is greater than a thickness of the second transflective layer.

7. The display device of claim 6, further comprising a filling layer, wherein the first transflective layer comprises at least one hole overlapped with the third opening, and the filling layer is disposed in the hole.

8. The display device of claim 6, wherein the first transflective layer comprises a plurality of first dielectric layers and a plurality of second dielectric layers alternately stacked on the substrate, and
   wherein the first dielectric layers comprise a first refractive index, the second dielectric layers comprise a second refractive index, and a difference between the first refractive index and the second refractive index is greater than or equal to 0.3.

9. The display device of claim 6, wherein the partition layer comprises a first wall part between the third opening and the first opening, the first wall part is separated from the substrate by the first transflective layer, and a surface of the first wall part facing the substrate has a first edge adjacent to the third opening, a surface of the first transflective layer facing the substrate has a second edge adjacent to the first edge, a spacing between a projection of the first edge projected on the surface of the first transflective layer in a normal direction of the display device and the second edge is defined as a first spacing, and the first spacing is greater than 0 and less than or equal to 10 micrometers.

10. The display device of claim 6, wherein the first transflective layer comprises a first part and a second part connected to the first part, the first part and the second part are overlapped with the third opening, and a thickness of the first part is greater than a thickness of the second part.

11. The display device of claim 6, further comprising a plurality of light scattering particles disposed in the third opening.

* * * * *